(12) United States Patent
Lee et al.

(10) Patent No.: US 10,204,999 B2
(45) Date of Patent: Feb. 12, 2019

(54) TRANSISTOR WITH AIRGAP SPACER

(71) Applicant: Intel Corporation, Santa Clara, CA (US)

(72) Inventors: Chen-Guan Lee, Portland, OR (US); Joodong Park, Portland, OR (US); En-Shao Liu, Portland, OR (US); Everett S. Cassidy-Comfort, Beaverton, OR (US); Walid M. Hafez, Portland, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/743,847

(22) PCT Filed: Jul. 17, 2015

(86) PCT No.: PCT/US2015/040936
§ 371 (c)(1),
(2) Date: Jan. 11, 2018

(87) PCT Pub. No.: WO2017/014725
PCT Pub. Date: Jan. 26, 2017

(65) Prior Publication Data
US 2018/0197966 A1    Jul. 12, 2018

(51) Int. Cl.
*H01L 29/49*    (2006.01)
*H01L 21/764*   (2006.01)
(Continued)

(52) U.S. Cl.
CPC ........ *H01L 29/4991* (2013.01); *H01L 21/764* (2013.01); *H01L 21/7682* (2013.01);
(Continued)

(58) Field of Classification Search
CPC ............... H01L 29/4991; H01L 29/515; H01L 29/66545; H01L 29/66575; H01L 21/764; H01L 21/76897; H01L 21/7682
See application file for complete search history.

(56) References Cited

U.S. PATENT DOCUMENTS

| 8,637,384 B2* | 1/2014 | Ando | H01L 29/66803 |
| | | | 257/347 |
| 2009/0321853 A1* | 12/2009 | Cheng | H01L 29/42368 |
| | | | 257/410 |

(Continued)

OTHER PUBLICATIONS

International Search Report and Written Opinion from PCT/US2015/040936 dated Aug. 24, 2016, 14 pgs.

*Primary Examiner* — Khiem D Nguyen
(74) *Attorney, Agent, or Firm* — Green, Howard & Mughal LLP

(57) ABSTRACT

A microelectronic transistor may be fabricated having an airgap spacer formed as a gate sidewall spacer, such that the airgap spacer is positioned between a gate electrode and a source contact and/or a drain contact of the microelectronic transistor. As the dielectric constant of gaseous substances is significantly lower than that of a solid or a semi-solid dielectric material, the airgap spacer may result in minimal capacitive coupling between the gate electrode and the source contact and/or the drain contact, which may reduce circuit delay of the microelectronic transistor.

8 Claims, 13 Drawing Sheets

(51) Int. Cl.
*H01L 29/66* (2006.01)
*H01L 29/78* (2006.01)
*H01L 21/768* (2006.01)

(52) U.S. Cl.
CPC .. *H01L 21/76897* (2013.01); *H01L 29/66545* (2013.01); *H01L 29/78* (2013.01)

(56) References Cited

U.S. PATENT DOCUMENTS

| | | | |
|---|---|---|---|
| 2011/0217838 A1 | 9/2011 | Hsieh et al. | |
| 2012/0199886 A1* | 8/2012 | Horak | H01L 21/76897 257/288 |
| 2012/0248511 A1* | 10/2012 | Guo | H01L 29/6653 257/288 |
| 2013/0093019 A1 | 4/2013 | Ando et al. | |
| 2013/0130489 A1 | 5/2013 | Horak et al. | |
| 2013/0221414 A1 | 8/2013 | Zhao et al. | |
| 2014/0138779 A1* | 5/2014 | Xie | H01L 29/66545 257/401 |
| 2015/0091089 A1* | 4/2015 | Niebojewski | H01L 29/0843 257/347 |
| 2015/0372102 A1* | 12/2015 | Usami | H01L 29/41775 257/327 |

\* cited by examiner

US 10,204,999 B2

TRANSISTOR WITH AIRGAP SPACER

CLAIM OF PRIORITY

This Application is a National Stage Entry of, and claims priority to, PCT Application No. PCT/US2015/040936, filed on 17 Jul. 2015 and titled "TRANSISTOR WITH AIRGAP SPACER", which is incorporated by reference in its entirety for all purposes.

TECHNICAL FIELD

Embodiments of the present description relate to the field of microelectronic devices, and, more particularly, to the fabrication of microelectronic transistors.

BACKGROUND

Higher performance, lower cost, increased miniaturization of integrated circuit components, and greater packaging density of integrated circuits are ongoing goals of the microelectronic industry for the fabrication of microelectronic devices. To achieve these goals, transistors within the microelectronic devices must scale down, i.e. become smaller. The reduction in the size of microelectronic transistors within the microelectronic devices has resulted in some difficulties with regard to the performance and efficiency of the microelectronic transistors. Thus, there has been a drive to improve their efficiency with improvement in their designs, materials used, and/or in their fabrication processes.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
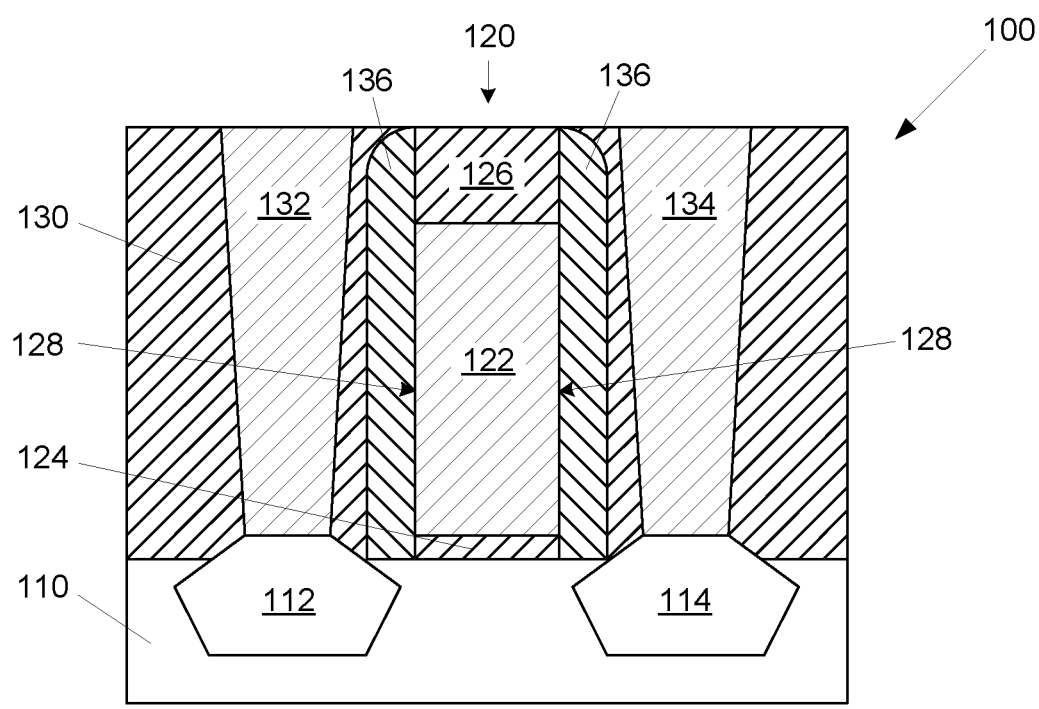
FIG. 1 illustrates a side cross sectional view of a microelectronic transistor, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

FIG. 1 illustrates a cross-sectional view of a microelectronic transistor 100, as known in the art. The microelectronic transistor 100 may be formed on and/or in a microelectronic substrate 110. As further shown in FIG. 1, a microelectronic transistor gate 120 may be formed on the microelectronic substrate 110. The microelectronic transistor gate 120 may include a gate electrode 122 with a gate dielectric 124 disposed between the gate electrode 122 and the microelectronic substrate 110 and may further include a hard mask 126 capping the gate electrode 122. The microelectronic transistor gate 120 may further include gate sidewall spacers 136 formed on opposing sidewalls 128 of the gate electrode 122. A source region 112 and a drain region 114 may be formed in the microelectronic substrate 110, such as by ion implantation of appropriate dopants, on opposing sides of the transistor gate 120. An interlayer dielectric material 130 may be disposed over the microelectronic substrate 110, and a source contact 132 and a drain contact 134 may be formed through the interlayer dielectric material 130 to electrically connect with the source region 112 and the drain region 114, respectively. The functions and fabrication processes for the components of the microelectronic transistor 100 and are well known in the art and for the sake of conciseness and clarity will not be discussed herein.

The microelectronic substrate 110 may be a bulk substrate composed of a single crystal of a material which may include, but is not limited to, silicon, germanium, silicon-germanium or a III-V compound semiconductor material. The microelectronic substrate 110 may also comprise a silicon-on-insulator substrate (SOI), wherein an upper insulator layer (not shown) composed of a material which may include, but is not limited to, silicon dioxide, silicon nitride or silicon oxynitride, disposed on the bulk substrate.

The gate electrode 122 may include any appropriate conductive material. In one embodiment, the gate electrode 122 may comprise a metal, including, but not limited to, pure metal and alloys of titanium, tungsten, tantalum, aluminum, copper, ruthenium, cobalt, chromium, iron, palladium, molybdenum, manganese, vanadium, gold, silver, and niobium. Less conductive metal carbides, such as titanium carbide, zirconium carbide, tantalum carbide, tungsten carbide, and tungsten carbide, may also be used. The gate electrode 122 may also be made from a metal nitride, such as titanium nitride and tantalum nitride, or a conductive metal oxide, such as ruthenium oxide. The gate electrode 122 may also include alloys with rare earths, such as terbium and dysprosium, or noble metals such as platinum.

The gate dielectric 124 may be formed from any well-known gate dielectric material, including but not limited to silicon dioxide ($SiO_2$), silicon oxynitride ($SiO_xN_y$), silicon nitride ($Si_3N_4$), and high-k dielectric materials, wherein the dielectric constant may comprise a value greater than about 4, such as hafnium oxide, hafnium silicon oxide, lanthanum oxide, lanthanum aluminum oxide, zirconium oxide, zirconium silicon oxide, tantalum oxide, tantalum silicon oxide, titanium oxide, barium strontium titanium oxide, barium titanium oxide, strontium titanium oxide, yttrium oxide, aluminum oxide, lead scandium tantalum oxide, and lead zinc niobate.

The interlayer dielectric material 130 may be any appropriate dielectric material, including, but not limited to, silicon dioxide, silicon nitride, and the like, and may be formed from a low-k (dielectric constant, k, such as 1.0-2.2) material.

The gate sidewall spacers 136 may be made of any appropriate dielectric material, such as silicon nitride (e.g. $Si_3N_4$), silicon oxynitride (e.g. SiON), silicon oxycarbonitride (e.g. SiOCN), or silicon carbonitride (e.g. SiCN). The gate sidewall spacers 136 are commonly used in transistor fabrication to electrically separate the gate electrode 122 from the source contact 132 and/or the drain contact 134. The gate sidewall spacers 136 may be made from a low-k dielectric material in order to reduce circuit delay due to capacitive coupling between the gate electrode 122 and the source contact 132 and/or the drain contact 134.

Embodiments of the present description include a microelectronic transistor which has an airgap spacer formed as a gate sidewall spacer and methods of fabricating the same. As the dielectric constant of gaseous substances is significantly lower than that of a solid or a semi-solid dielectric material, the airgap spacer may result in minimal capacitive coupling between the gate electrode and the source contact and/or the drain contact, which may reduce circuit delay of the microelectronic transistor.

Figure 2:
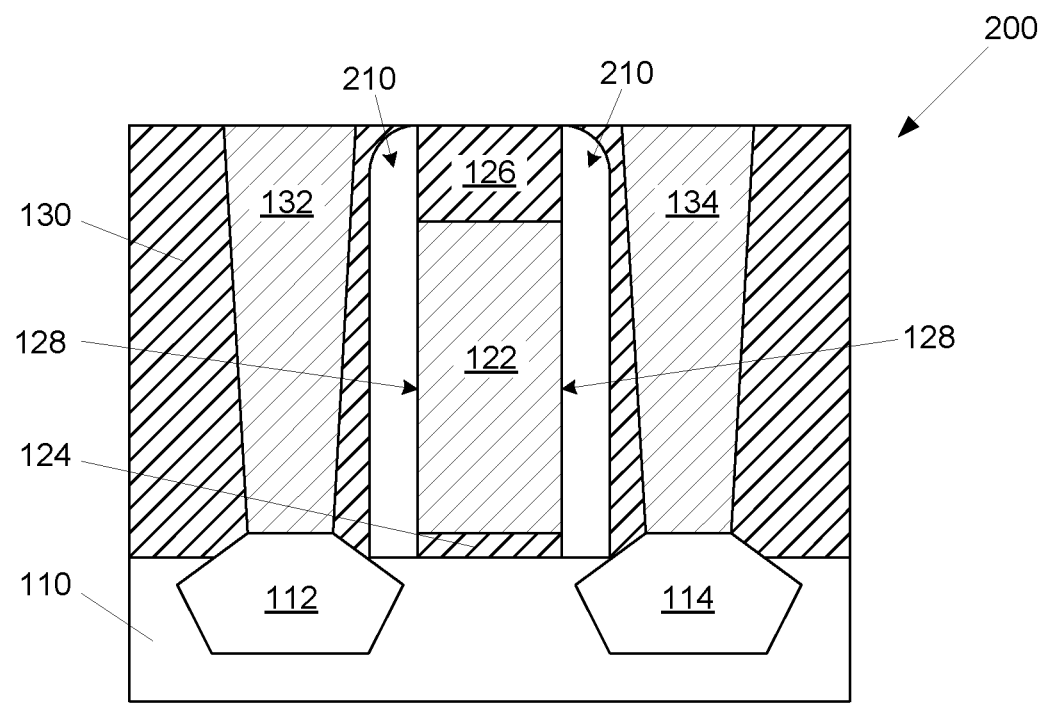
FIG. 2 illustrates a side cross sectional view of a microelectronic transistor having airgap spacers, according to an embodiment of the present description.

FIG. 2 illustrates a cross-sectional view of a microelectronic transistor 200, according to one embodiment of the present description, wherein the gate sidewall spacers 136 of FIG. 1 are replaced with airgap spacers 210. It is understood that although the term "airgap" is used herein, the definition of "airgap" includes any void filled with any substantially inert gas or gaseous substance, including by not limited to air.

FIGS. 3-17 illustrate one embodiment for the fabrication of the microelectronic transistor 200 (see FIG. 17) and an end-to-end structure 205 (see FIG. 17), which is used for isolation of the microelectronic transistors 200. It is understood that although the present description illustrates a specific transistor configuration, the embodiments of the present description may be applied to any transistor configuration, both non-planar and planar.

Figure 3:
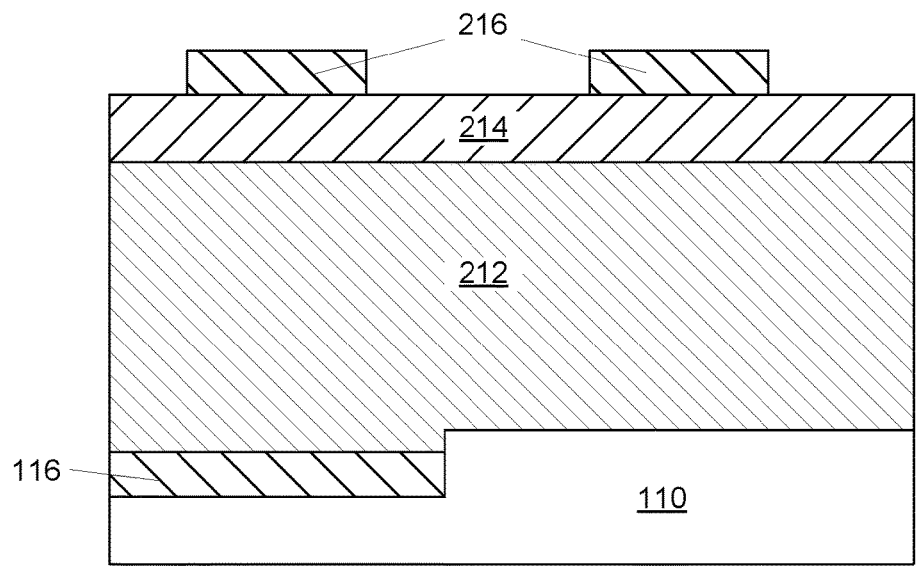
FIGS. 3-17 illustrate cross sectional views of a process of fabricating a microelectronic transistor having at least one airgap spacer, according to one embodiment of the present description.

As shown in FIG. 3, the microelectronic substrate 110 is formed with a dielectric isolation structure 116 formed therein, such as a shallow trench isolation structure known in the art. A sacrificial material layer 212, such as polysilicon or amorphous silicon, may be formed on the microelectronic substrate 110 and the dielectric isolation structure 116. A hard mask material layer 214, such as silicon nitride, silicon carbide, or silicon oxynitride, may be formed on the sacrificial material layer 212. Etch block structures 216 may then be patterned on the hard mask material layer 214. The processes for forming the dielectric isolation structure 116, the sacrificial material layer 212, the hard mask material layer 214, and the etch block structures 216 are well known in the art and for the sake of conciseness and clarity will not be discussed herein.

Figure 4:
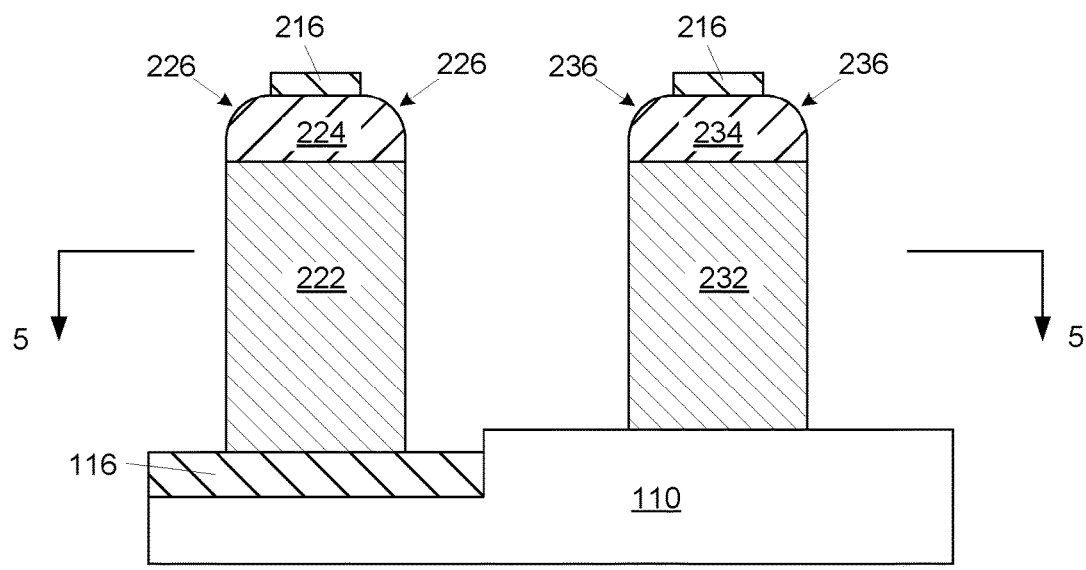

As shown in FIG. 4, the structure of FIG. 3 may be etched, which translates the patterned etch block structures 216 into the hard mask material layer 214 and the sacrificial material layer 212 to form a first sacrificial material structure 222 with a first hard mask 224 (shown at a position on the dielectric isolation structure 116) and a second sacrificial material structure 232 with a second hard mask 234 (shown at a position on the microelectronic substrate 110). The etch block structures 216 may be selected from materials which has low etch selectivity to the hard mask material layer 214, which results in the etch block material shrinking during the etching process, thereby forming curved surfaces 226 in the first hard mask 224 and also forming curved surfaces 236 in the second hard mask 234.

Figure 5:
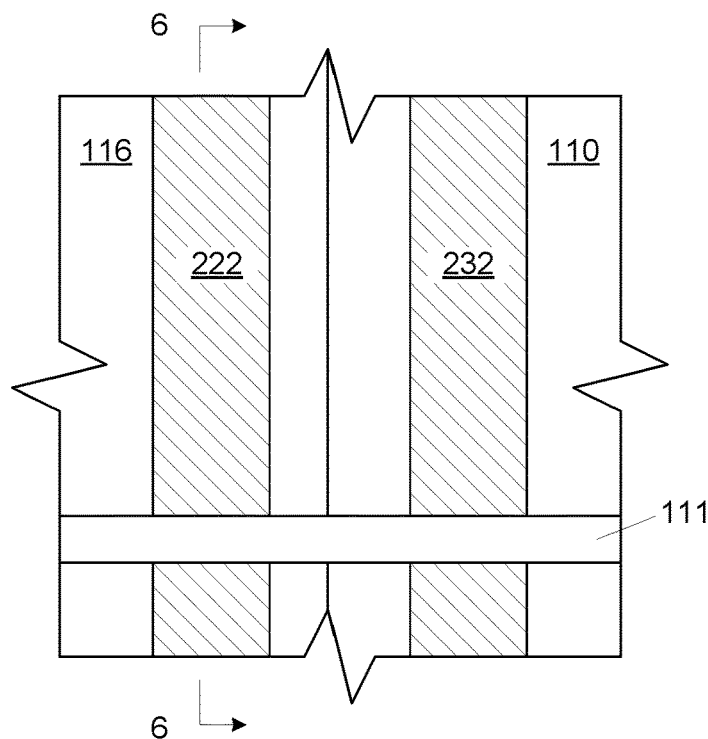
Figure 6:
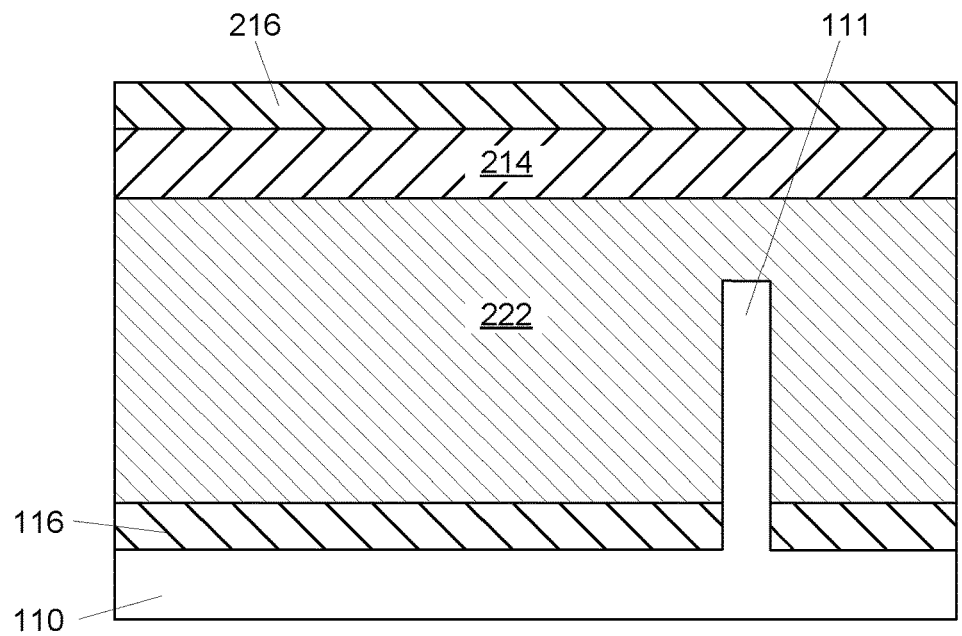

As shown in FIG. 5, which is a cross sectional view along line 5-5 of FIG. 4, the first sacrificial material structure 222 and the second sacrificial 232 may be non-planar structures extending along the dielectric isolation structure 116 and the microelectronic substrate 110. As will be understood to those skilled in the art, the first sacrificial material structure 222 will also extend onto at least one portion (not specifically illustrated) of the microelectronic substrate 110 and the second sacrificial material structure 232 will extend onto at least one associated dielectric isolation structure (not shown). As will be further understood, at least one microelectronic transistor 200 (see FIG. 17) will be formed from each of the first sacrificial material structure 222 and the second sacrificial material structure 232 where they extend on the microelectronic substrate 110, and at least one end-to-end structure 205 (see FIG. 17) will be formed from each of the first sacrificial material structure 222 and the second sacrificial material structure 232 where they extend on their associated dielectric isolation structures. Thus, as the microelectronic transistors 200 (see FIG. 12) and the end-to-end structures 205 (see FIG. 12) are formed simultaneously in the present embodiment, the formation thereof are illustrated on separate sacrificial material structures for clarity. Furthermore, it is noted that a microelectronic substrate fin 111 may extend from the microelectronic substrate 110 to illustrate to those skilled in the art that the non-planar microelectronic transistors may be formed. The fabrication processes for the components of the non-planar microelectronic transistor, as they may differ slightly from the embodiment illustrated herein, are well known in the art and for the sake of conciseness and clarity will not be discussed herein. FIG. 6 illustrates a side-cross sectional view along line 6-6 of FIG. 5.

Figure 7:
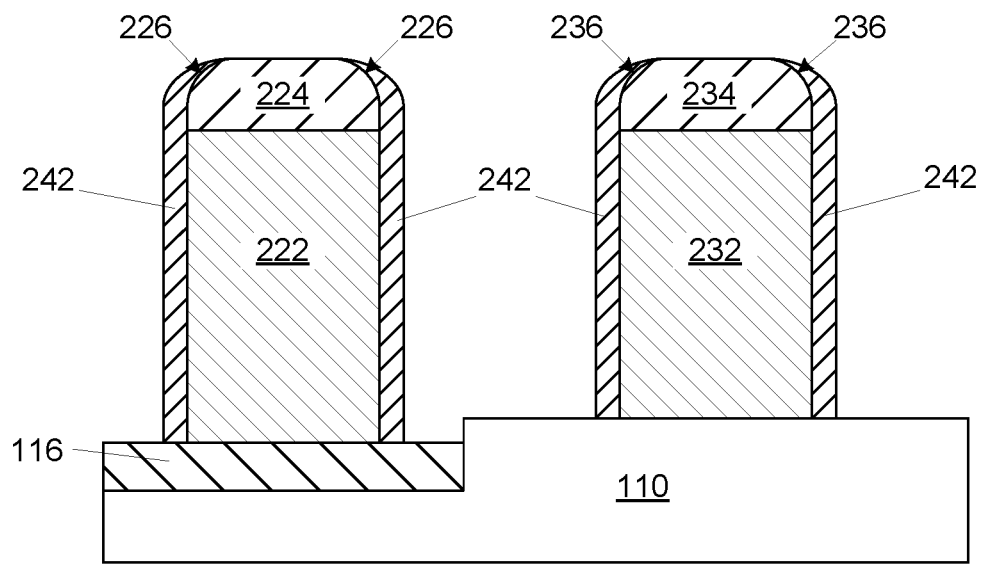

As shown in FIG. 7, the etch block structures 216 (see FIG. 4) may be removed and sacrificial spacers 242 may be formed adjacent the first sacrificial material structure 222 and the second sacrificial material structure 232. The sacrificial spacers 242 may be used prevent damage to the second gate material structure 232 during the formation of the source region 112 and the drain region 114, as will be discussed. The sacrificial spacers 242 may be formed by any known techniques, including, but not limited to a conformal deposition of the sacrificial material followed by an anisotropic etch.

Figure 8:
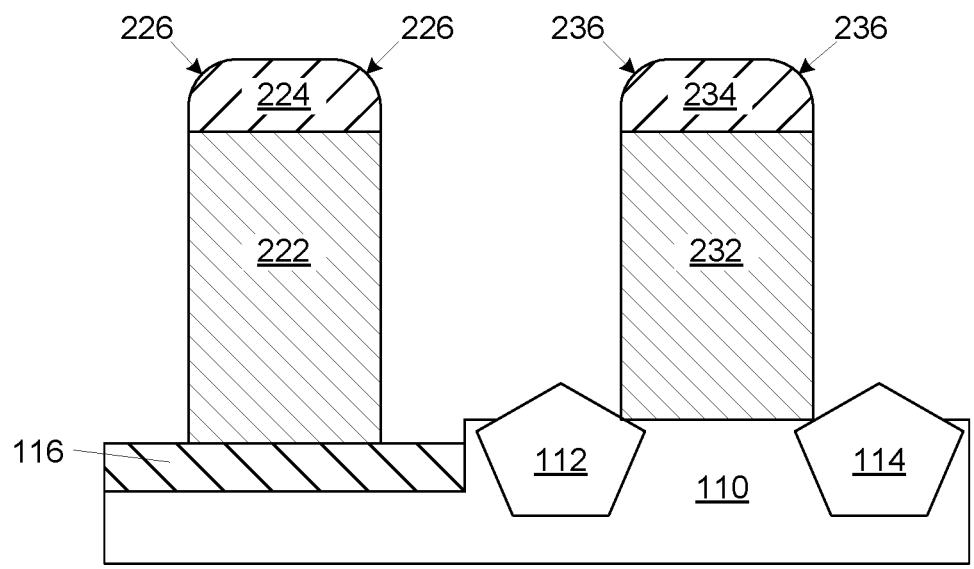

As shown in FIG. 8, the source region 112 and the drain region 114 may be formed and the sacrificial spacer 242 (see FIG. 7) may be removed thereafter. In one embodiment, the source region 112 and the drain region 114 may be formed by performing an undercut process in the microelectronic substrate 110 followed by an epitaxial regrowth process. These processes are well known in the art and for the sake of conciseness and clarity will not be discussed herein.

Figure 9:
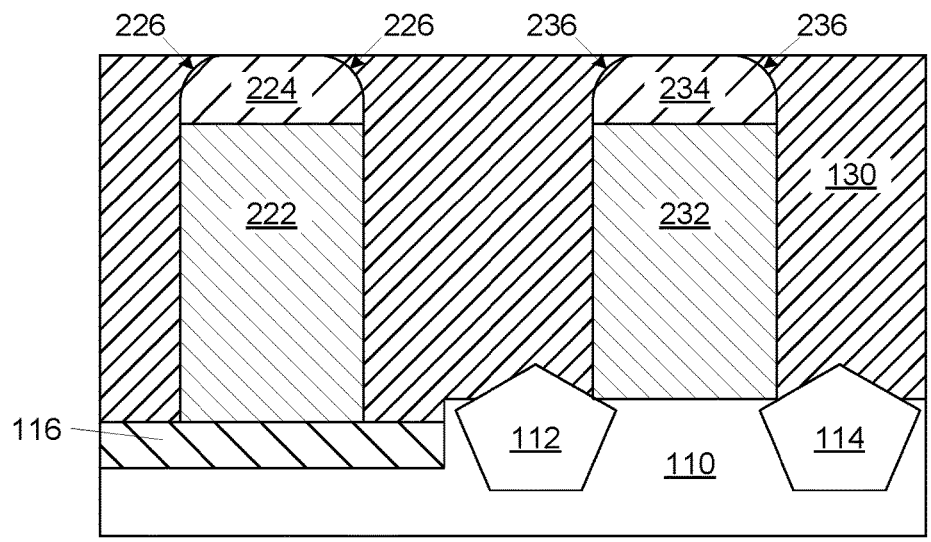

As shown in FIG. 9, the interlayer dielectric material 130 may be deposited over the microelectronic substrate 110, the source region 112, the drain region 114, the dielectric isolation region 116, the first hard mask 224, the second hard mask 234, and adjacent the first sacrificial material structure 222 and the second sacrificial material structure 232. As further shown in FIG. 9, the interlayer dielectric material 130 may be planarized to expose a portion of the first hard mask 224 and the second hard mask 234.

Figure 10:
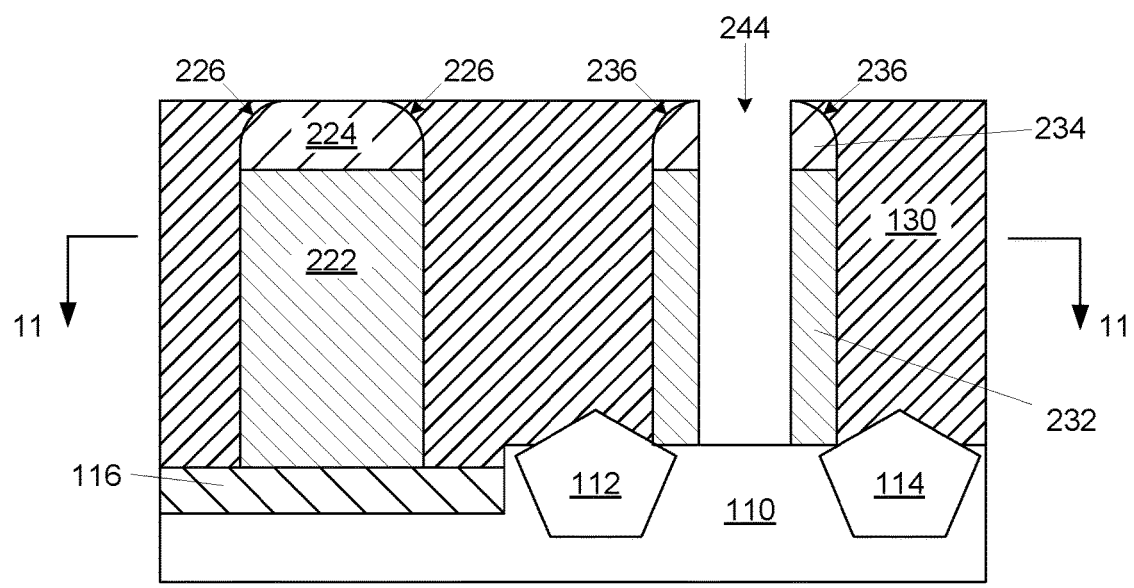
Figure 11:
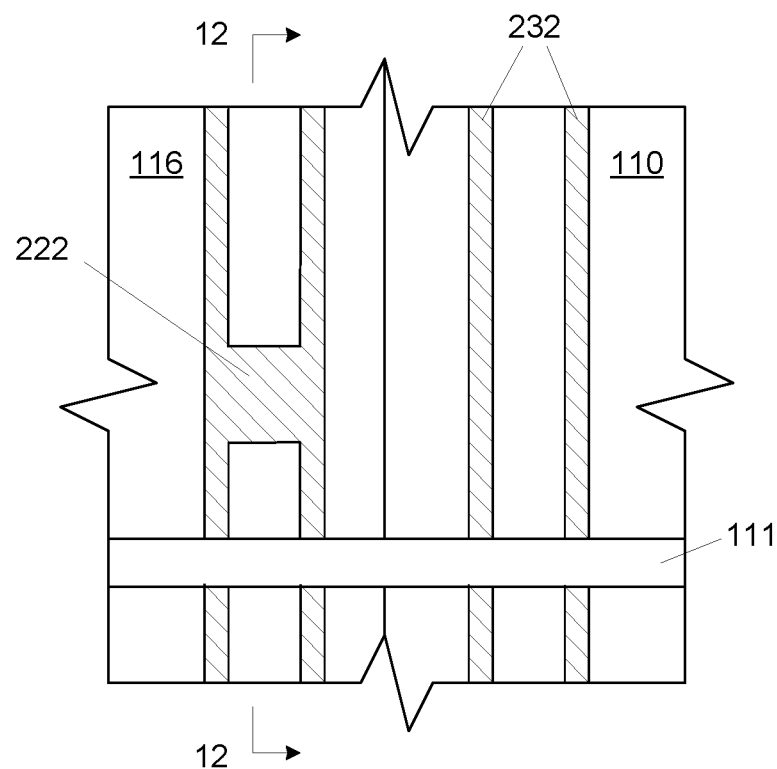
Figure 12:
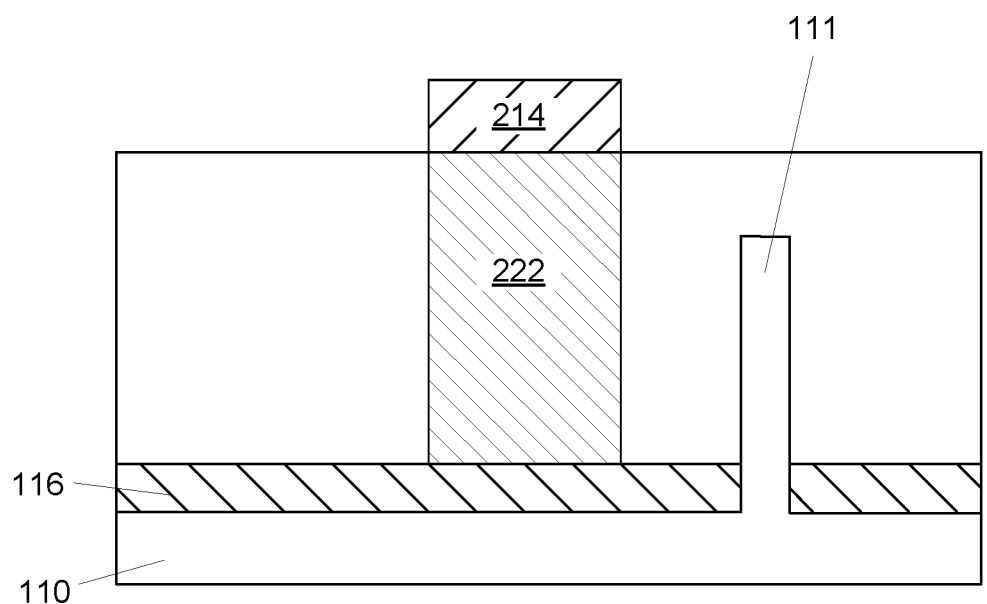

As shown in FIG. 10, a trench 244 may be formed through a portion of the second hard mask 234 and a portion of the second sacrificial material structure 232 to expose a portion of the microelectronic substrate 110. The trench 244 may be formed by patterning an etch mask (not shown) on the interlayer dielectric 130 and performing an anisotropic etch, such as a dry etch. The etching may be performed with selectivity between the interlayer dielectric 130 and second hard mask 234/second sacrificial material structure 232. Thus, due to the second hard mask curved surface 236, a portion of the interlayer dielectric 130 extends over and protects a portion of the second hard mask 234 and a portion of the second sacrificial material structure 232. FIG. 11 (cross-section along line 11-11 for FIG. 10) and FIG. 12 (cross-section along line 12-12 of FIG. 12) illustrate that the pattern etched to form the trench 244 may also be formed into a portion of the first sacrificial material structure 222, such that when the first sacrificial material structure 222 extends (not shown) onto the microelectronic substrate 110, the same structure as illustrated with regard to the second sacrificial material structure 232 will extends for the formation of microelectronic transistors thereon.

Figure 13:
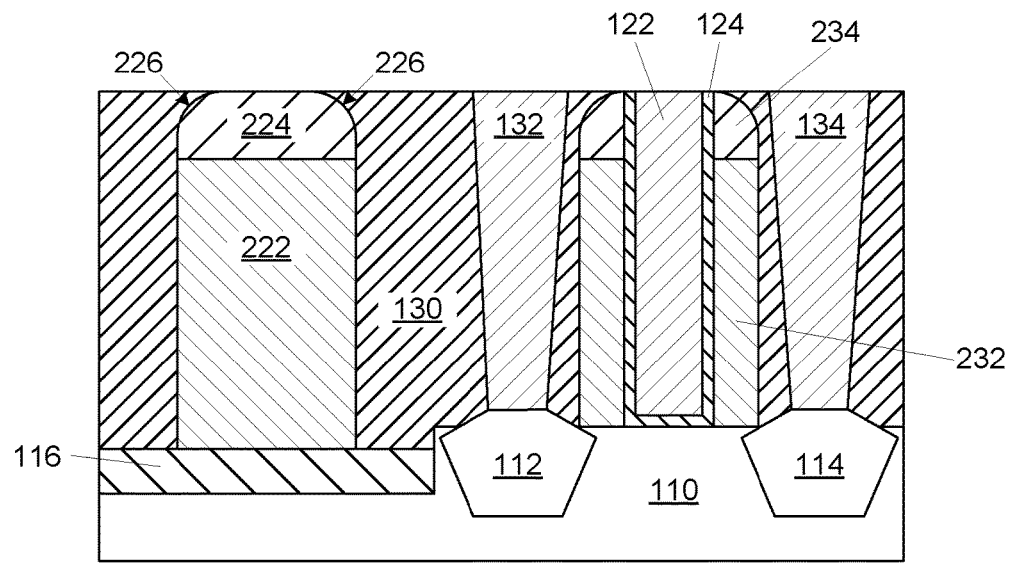

As shown in FIG. 13, the gate electrode 122 and the gate dielectric layer 124 may be formed in the trench 244 (see FIG. 10), wherein the gate dielectric layer 124 is disposed between the gate electrode 122 and the microelectronic substrate 110. Although the gate dielectric layer 124 is illustrated as a conformal deposition thereof, the gate dielectric layer 124 may be formed as only a layer at the bottom of the trench 244 (see FIG. 10) to abut the microelectronic substrate 110, such as shown in FIG. 2. As further shown in FIG. 13, the source contact 132 and the drain contact 134 may be formed through the interlayer dielectric material 130 to electrically connect with the source region 112 and the drain region 114, respectively. The processes for forming the gate dielectric layer 124, the gate electrode 122, the source contact 132, and the drain contact 134 are well known in the art and for the sake of conciseness and clarity will not be discussed herein.

Figure 14:
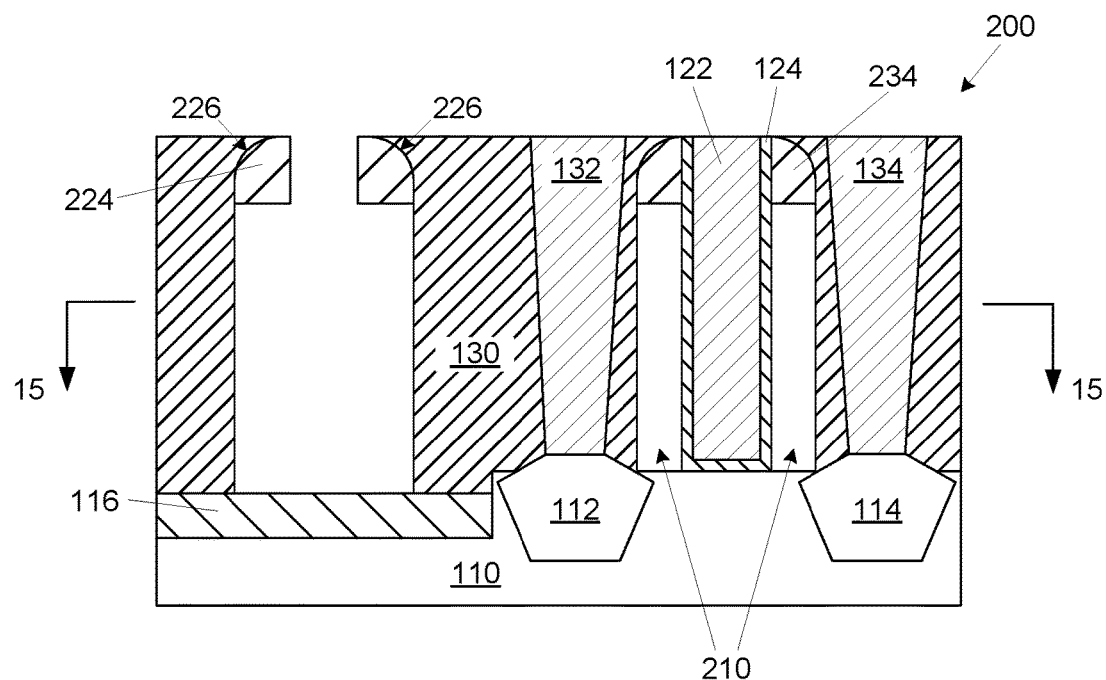
Figure 15:
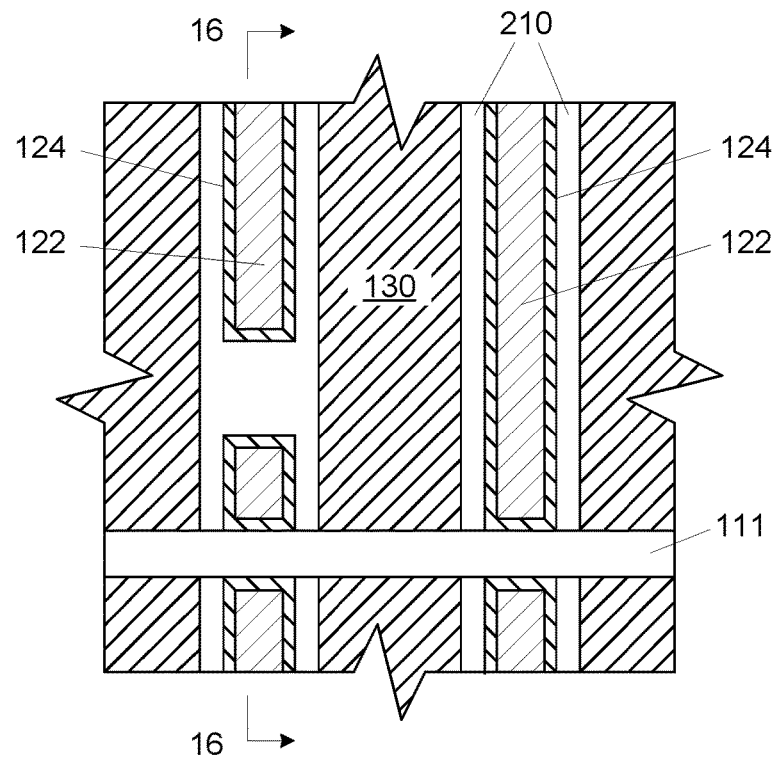
Figure 16:
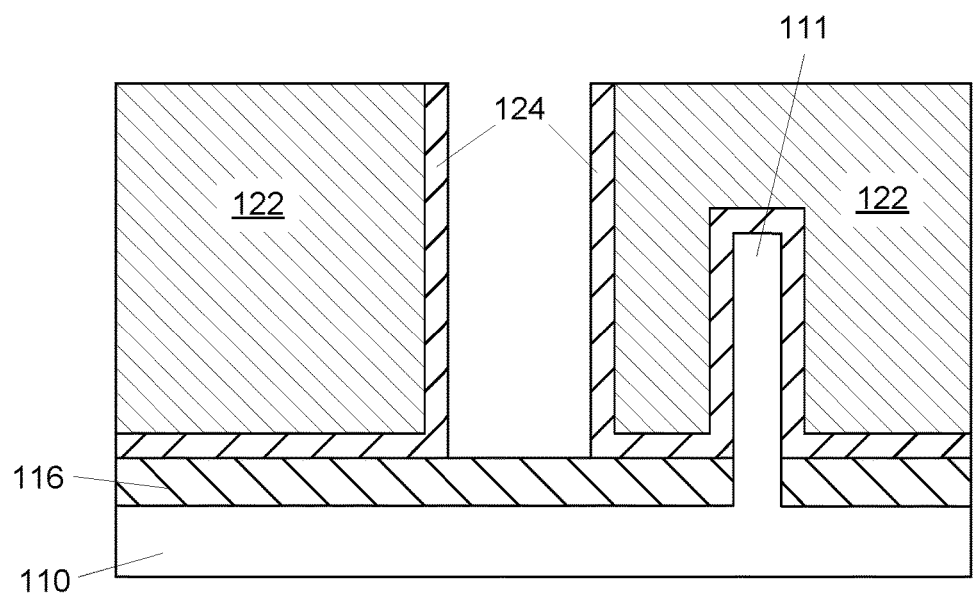
Figure 17:
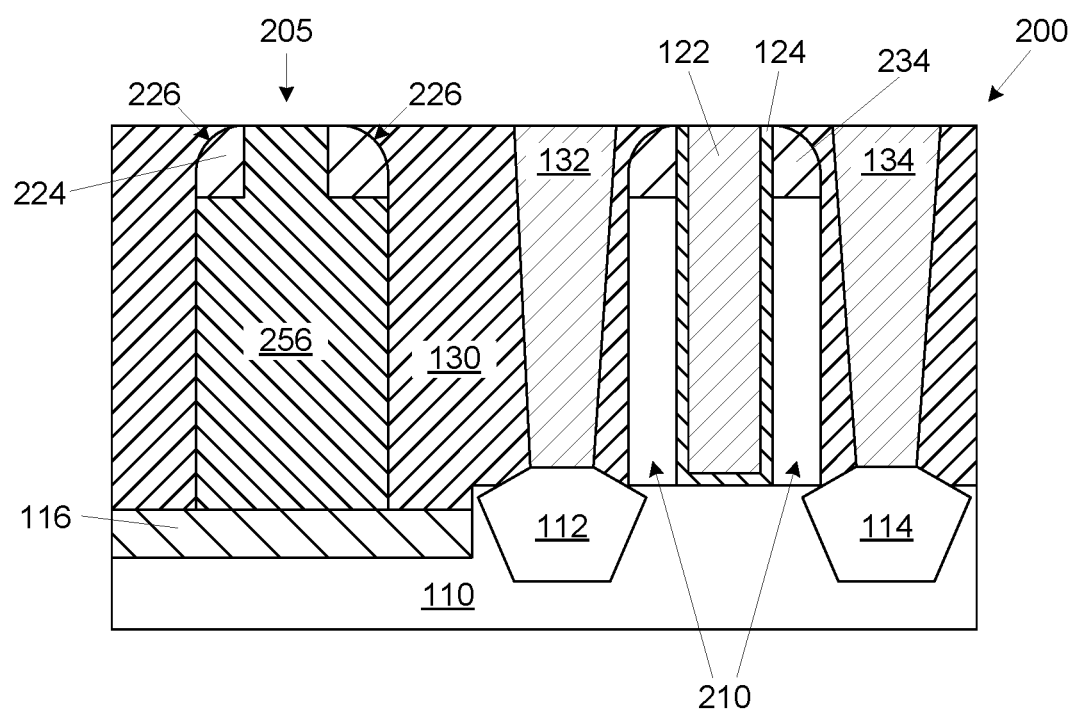

As shown in FIG. 14, the first hard mask 224 may be etched, such as by anisotropic etch, and the first sacrificial material structure 222 (see FIG. 13) may be removed with an isotropic etch, such as a wet etch, at the area for the formation of the end-to-end structure 205 (see FIG. 17). As shown in FIGS. 15 and 16, the entire first sacrificial material structure 222 (see FIG. 13) is substantially removed, which would include portions thereof that would extend onto at least one portion (not specifically illustrated) of the microelectronic substrate 110 for the formation of microelectronic transistors, as previously discussed. Likewise, as the second sacrificial material structure 232 (see FIG. 13) will extend onto at least one associated dielectric isolation structure (not shown) for the formation of at least one associated end-to-end structure, the removal of the second sacrificial material structure 232 (see FIG. 13) at the area for the formation of the end-to-end structure will also remove the second sacrificial material structure at the gate dielectric 124 and the gate electrode 122 to form airgap spacers 210, thereby forming the microelectronic transistor 200.

As shown in FIG. 17, a dielectric plug material 256 may be deposited to fill the void left by the removal of the first sacrificial material structure 222 (see FIG. 13), thereby forming the end-to-end structure 205. In one embodiment, the dielectric plug material 256 may be deposited by a non-conformal deposition process, such as physical vapor deposition, so that the dielectric plug material 256 only fills the area over the dielectric isolation structure 116 and does not migrate to airgap spacers of associated microelectronic transistors.

Figure 18:
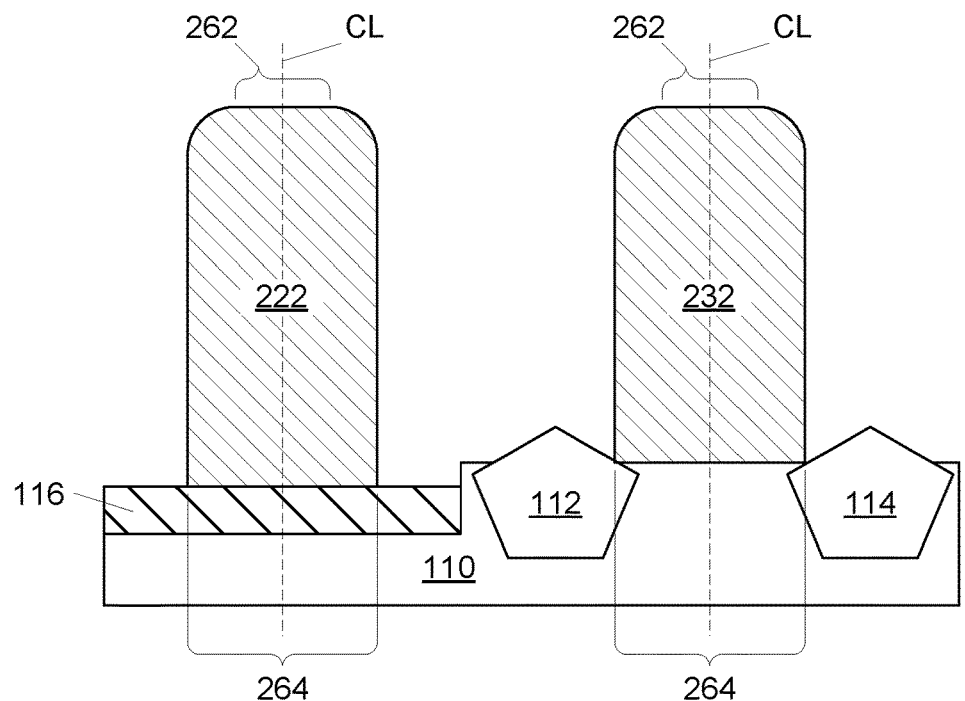
FIGS. 18-23 illustrate cross sectional views of a process of fabrication a microelectronic transistor having at least one airgap spacer, according to another embodiment of the present description.

FIGS. 18-23 illustrate another embodiment of the present description, wherein the microelectronic transistor may be formed without a hard mask. It is noted that in this embodiment, the sacrificial material layer 212 (see FIG. 3) used to form the first sacrificial material structure 222 and the second sacrificial gate material structure 232 must have very good selectivity to both the microelectronic substrate 110 and the interlayer dielectric 130. As shown in FIG. 18, the first sacrificial material structure 222 and the second sacrificial material structure 232 may each be fabricated with a top surface 262 that is smaller than and substantially aligned with a bottom surface 264, which abuts the dielectric isolation structure 116 and the microelectronic substrate 110, respectively. The term "aligned with", as used herein, may be defined to mean that the top surface 262 and the bottom surface 264 substantially share a common centerline CL. It is understood that although the illustrated smaller top surface 262 is a result of forming curved surfaces, such as shown in FIGS. 3-17 with regard to the first hard mask 224 and the second hard mask 234, the present description is not so limited, as the first sacrificial structure 222 and/or the second sacrificial gate material structure 232 can be formed in any appropriate shape, such as a polygon in cross section, so long as the top surface 262 is smaller than and substantially aligned with the bottom surface 264 thereof. It is noted that FIG. 18 illustrates a structure after the fabrication of the source region 112 and the drain region 114, as previously discussed.

Figure 19:
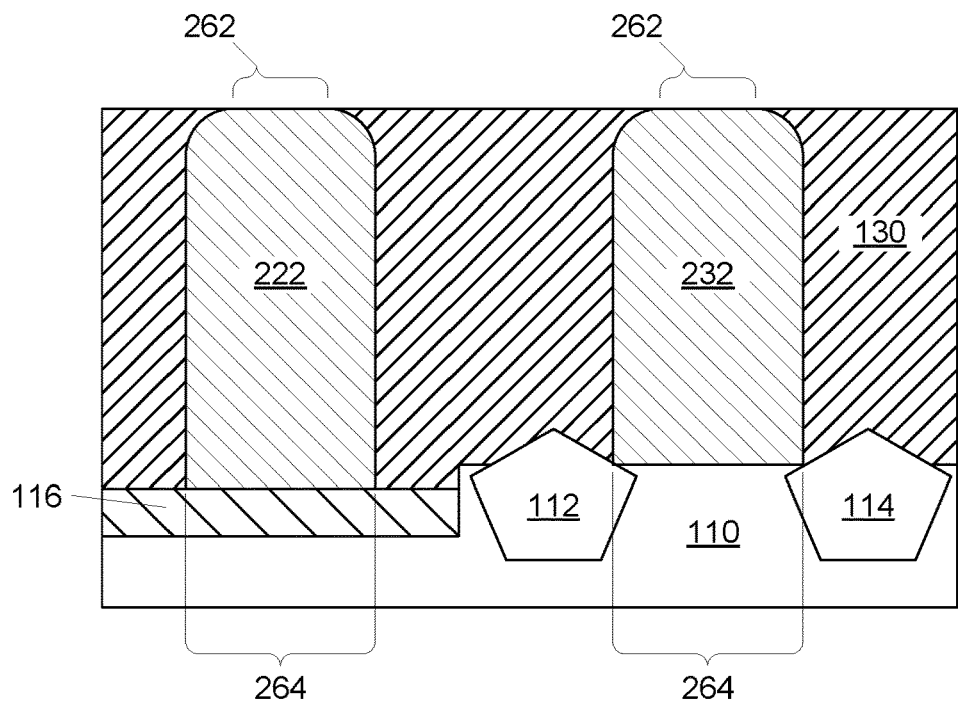

As shown in FIG. 19, the interlayer dielectric material 130 may be deposited over the microelectronic substrate 110, the source region 112, the drain region 114, the dielectric isolation region 116, and adjacent the first sacrificial material structure 222 and the second sacrificial material structure 232. As further shown in FIG. 19, the interlayer dielectric material 130 may be planarized to expose the top surface 262 of the first sacrificial material structure 222 and the second sacrificial material structure 232.

Figure 20:
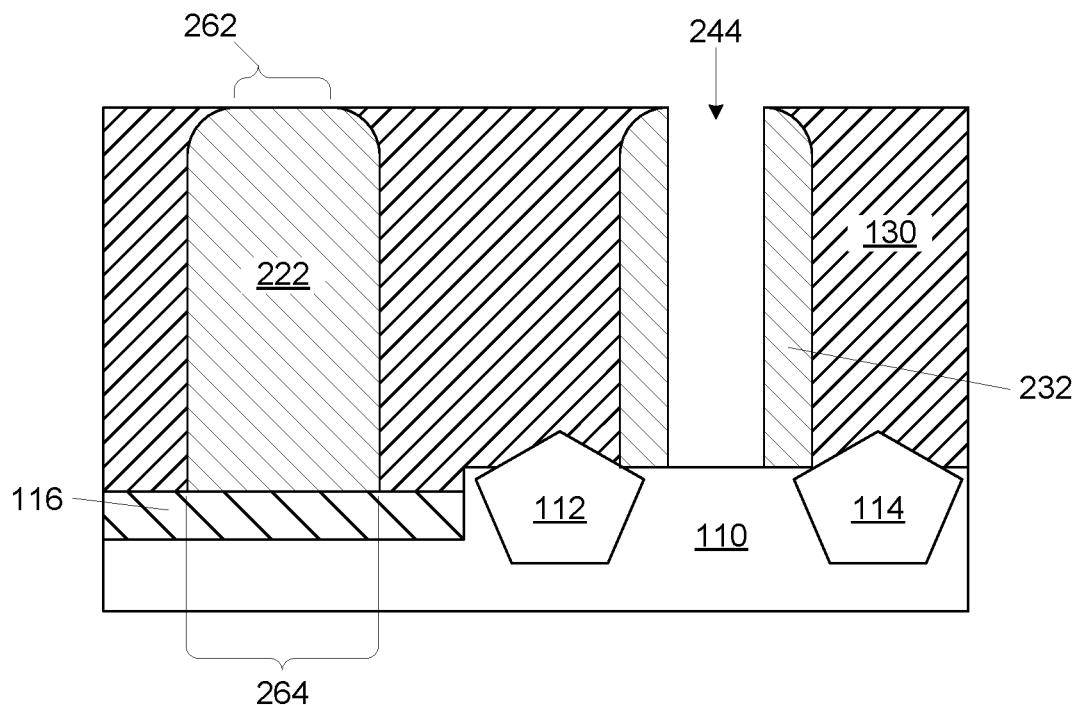

As shown in FIG. 20, the trench 244 may be formed through a portion of the second sacrificial material structure 232 to expose a portion of the microelectronic substrate 110. As previously discussed, the trench 244 may be formed by patterning an etch mask (not shown) on the interlayer dielectric 130 and performing an anisotropic etch, such as a dry etch. The etching may be performed with selectivity between the interlayer dielectric 130 and the second sacrificial material structure 232. Thus, due to the top surface 262 of the second sacrificial material structure 232 being smaller than the bottom surface 264 of the second sacrificial material structure 232, a portion of the interlayer dielectric 130 extends over and protects a portion of the second sacrificial material structure 232.

Figure 21:
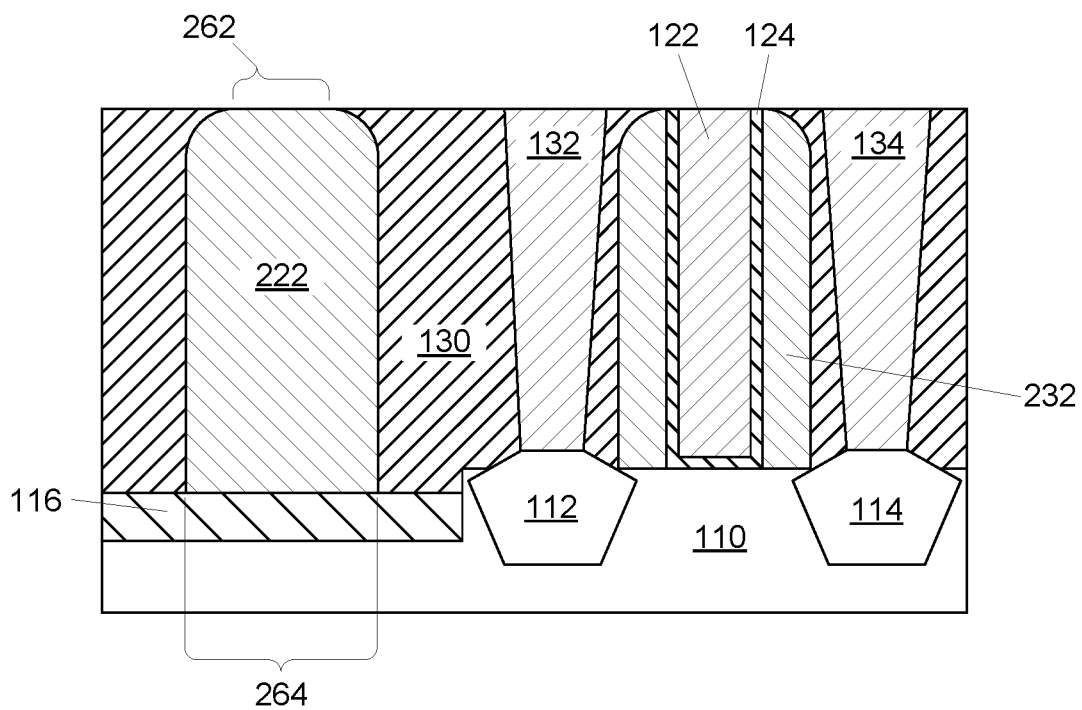

As shown in FIG. 21, the gate dielectric layer 124 and the gate electrode 122 may be formed in the trench 244 (see FIG. 20), wherein the gate dielectric layer 124 is disposed between the gate electrode 122 and the microelectronic substrate 110. As further shown in FIG. 16, the source contact 132 and the drain contact 134 may be formed through the interlayer dielectric material 130 to electrically connect with the source region 112 and the drain region 114, respectively.

Figure 22:
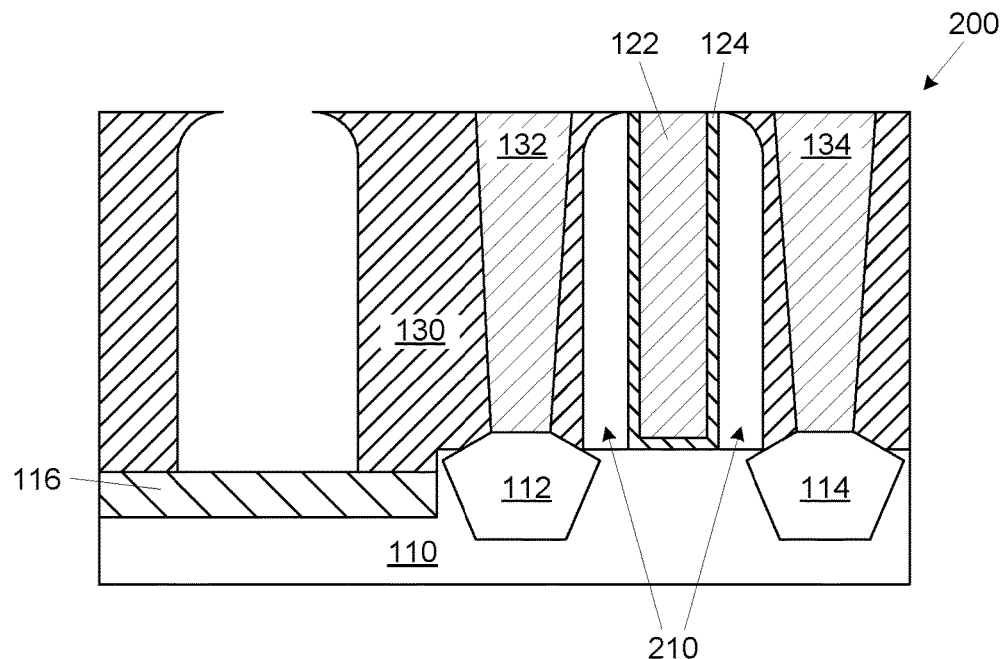

As shown in FIG. 22, the first sacrificial material structure 222 (see FIG. 21) and the second sacrificial material structure may be removed with an isotropic etch, such as a wet etch, in the manner discussed with regard to FIGS. 14-16, wherein airgap spacers 210 are formed proximate the gate dielectric 124 and the gate electrode 122, thereby forming the microelectronic transistor 200.

Figure 23:
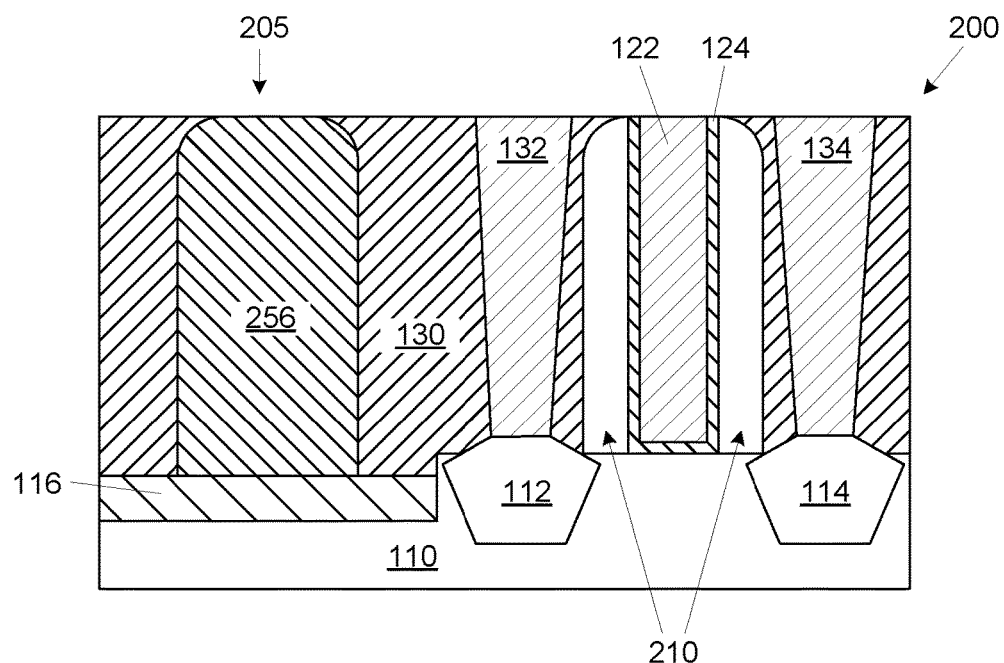

As shown in FIG. 23, a dielectric plug material 256 may be deposited to fill the void left by the removal of the first sacrificial material structure 222 (see FIG. 16), thereby forming the end-to-end structure 205. In one embodiment, the dielectric plug material 256 may be deposited by a non-conformal deposition process, such as physical vapor deposition, so that the dielectric plug material 256 only fills the area over the dielectric isolation structure 116 and does not migrate to airgap spacers in the at least one microelectronic transistor that formed along the first sacrificial material structure 222, as previously discussed.

As illustrated in FIGS. 17 and 23, the microelectronic transistors 210 have their respective airgap spacers 210 positioned between the gate electrode 122 and at least one of the source contact 132 and the drain contact 134. As will be understood to those skilled in the art, this configuration may significantly reduce capacitive coupling between the gate electrode 122 and at least one of the source contact 132 and the drain contact 134, which may reduce circuit delay compared to microelectronic transistors having spacers formed from solid or a semi-solid dielectric materials.

Figure 24:
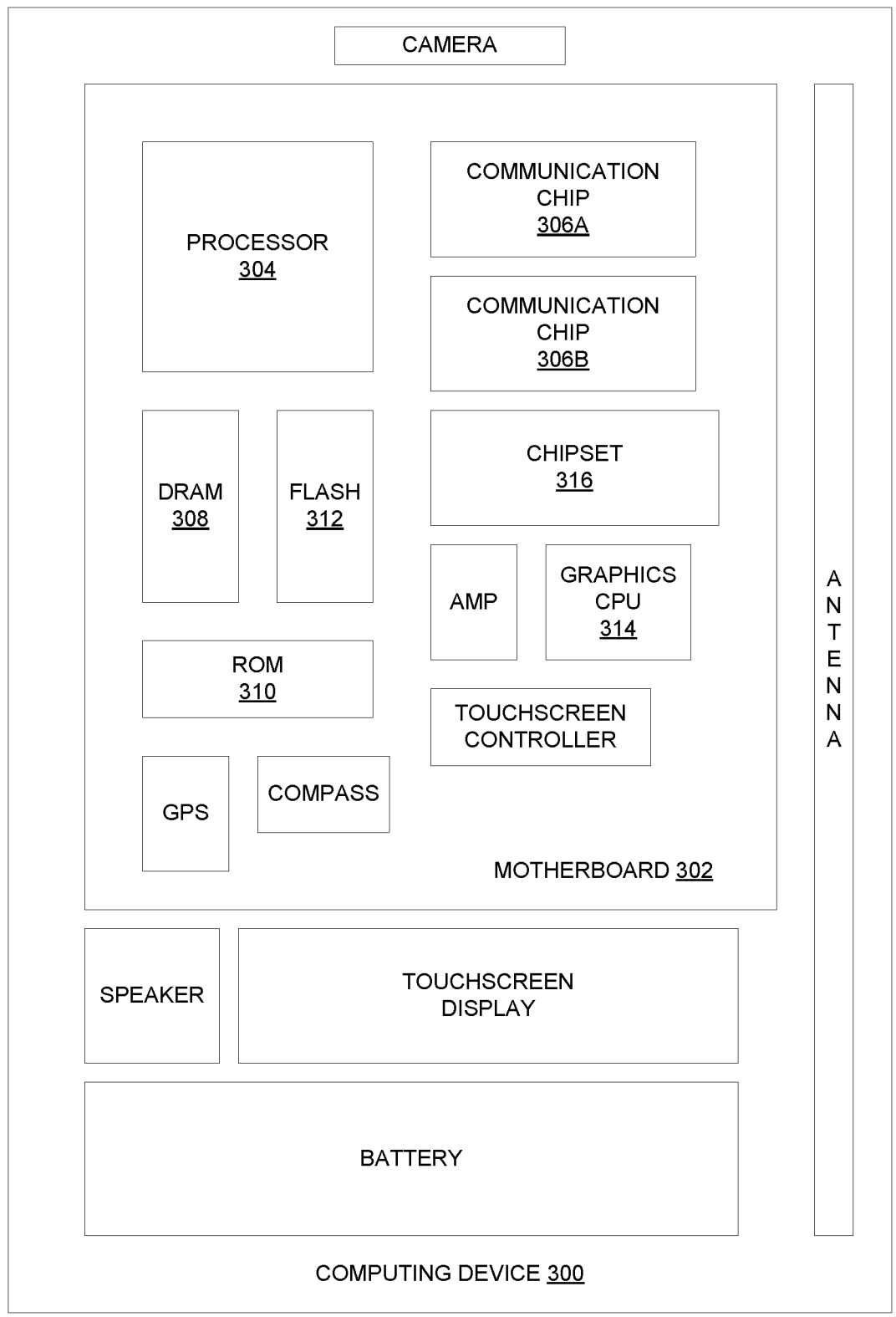
FIG. 24 illustrates a computing device in accordance with one implementation of the present description.

FIG. 24 illustrates a computing device 300 in accordance with one implementation of the present description. The computing device 300 houses a board 302. The board may include a number of microelectronic components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 having microelectronic transistors may include airgap spacers positioned between a gate electrode and at least one of a source contact and a drain contact, which may significantly reduce capacitive coupling between the gate electrode and at least one of the source contact and the drain contact, thereby reducing circuit delay compared to microelectronic transistors having spacers formed from solid or semi-solid dielectric materials, as described herein.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-19. The subject matter may be applied to other microelectronic transistor configurations, as will be understood to those skilled in the art.

The following examples pertain to further embodiments, wherein Example 1 is a microelectronic transistor, comprising a microelectronic substrate; a source region and a drain region formed in the microelectronic substrate; an interlayer dielectric disposed over the microelectronic substrate; a source contact extending through the interlayer dielectric and electrically contacting the source region; a drain contact extending through the interlayer dielectric and electrically contacting the source region; a gate electrode positioned between the source contact and the drain contact; and an airgap spacer positioned between the gate electrode and at least one of the source contact and the drain contact.

In Example 2, the subject matter of Example 1 can optionally include the airgap spacer comprising a void having a gas disposed therein.

In Example 3, the subject matter of Example 2 can optionally include the gas comprising air.

In Example 4, the subject matter of any of Examples 1 to 3 can optionally include a gate hard mask, wherein the gate electrode extends through the gate hard mask.

In Example 5, the subject matter of any of Examples 1 to 3 can optionally include a gate dielectric layer disposed between the gate electrode and the microelectronic substrate.

In Example 6, the subject matter of Example 5 can optionally include the gate dielectric layer comprising a conformal layer abutting the gate electrode.

The following examples pertain to further embodiments, wherein Example 7 is a method of fabricating a microelectronic transistor comprising: forming a microelectronic substrate; forming a source region and a drain region in the microelectronic substrate; forming an interlayer dielectric material over the microelectronic substrate; forming a source contact extending through the interlayer dielectric material and electrically contacting the source region; forming a drain contact extending through the interlayer dielectric material and electrically contacting the source region; forming a gate electrode positioned between the source contact and the drain contact; and forming an airgap spacer positioned between the gate electrode and at least one of the source contact and the drain contact.

In Example 8, the subject matter of Example 7 can optionally include forming the airgap spacer comprising forming a void having a gas disposed therein.

In Example 9, the subject matter of Example 8 can optionally include forming the void having a gas disposed therein comprising forming a void having air disposed therein.

In Example 10, the subject matter of any of Examples 7 to 9 can optionally include forming a gate dielectric layer disposed between the gate electrode and the microelectronic substrate.

In Example 11, the subject matter of any of Examples 7 to 9 can optionally include forming a sacrificial material layer on the microelectronic substrate and forming a hard mask material layer on the sacrificial material layer prior to forming a source region and a drain region in the microelectronic substrate; patterning an etch block structure on the hard mask material layer, wherein the etch block structure has low etch selectively to the hard mask material layer; etching the sacrificial material layer and the hard mask material layer to form a sacrificial gate material structure with a hard mask thereon, wherein the etch block structure shrinks during the etching process to form curved surfaces of the hard mask prior to forming of the interlayer dielectric material; planarizing the interlayer dielectric material to expose a portion of the hard mask; selectively etching a trench through a portion of the sacrificial gate material structure, wherein a portion of the interlayer dielectric material abutting the hard mask curved surfaces extends over and protects a portion of the hard mask and a portion of the sacrificial gate material structure that remains after the selective etching of the trench; forming a gate dielectric layer and the gate electrode in the trench, wherein the gate dielectric layer is disposed between the gate electrode and the microelectronic substrate; and removing the portion of the sacrificial gate material remaining after selectively etching the trench to form the airgap spacers.

In Example 12, the subject matter of Example 11 can optionally include forming the gate dielectric layer and the gate electrode in the trench comprising forming a conformal gate dielectric layer within the trench and forming the gate electrode on the gate dielectric layer.

In Example 13, the subject matter of Example 7 can optionally include forming the airgap spacer comprising forming a sacrificial material structure on the microelectronic substrate prior to forming the interlayer dielectric, wherein a top surface of the sacrificial gate material structure is smaller than and aligned with an opposing bottom surface of the sacrificial material structure that abuts the microelectronic substrate; planarizing the interlayer dielectric material to expose the top surface of the sacrificial material structure; selectively etching a trench through a portion of the sacrificial material structure, wherein a portion of the interlayer dielectric material extends over and protects a portion of the sacrificial material structure that remains after the selective etching of the trench; forming a gate dielectric layer and the gate electrode in the trench, wherein the gate dielectric layer is disposed between the gate electrode and the microelectronic substrate; and removing the portion of the sacrificial gate material remaining after selectively etching the trench to form the airgap spacers.

In Example 14, the subject matter of Example 13 can optionally include forming the gate dielectric layer and the gate electrode in the trench comprising forming a conformal gate dielectric layer within the trench and forming the gate electrode on the gate dielectric layer.

The following examples pertain to further embodiments, wherein Example 15 is an electronic system, comprising: a board; and a microelectronic component attached to the board, wherein the microelectronic component includes a microelectronic transistor comprising a microelectronic substrate; a source region and a drain region formed in the microelectronic substrate; an interlayer dielectric disposed over the microelectronic substrate; a source contact extending through the interlayer dielectric and electrically contacting the source region; a drain contact extending through the interlayer dielectric and electrically contacting the source region; a gate electrode positioned between the source contact and the drain contact; and an airgap spacer positioned between the gate electrode and at least one of the source contact and the drain contact.

In Example 16, the subject matter of Example 15 can optionally include the airgap spacer comprising a void having a gas disposed therein.

In Example 17, the subject matter of Example 16 can optionally include the gas comprises air.

In Example 18, the subject matter of any of Examples 15 to 17 can optionally include a gate hard mask, wherein the gate electrode extends through the gate hard mask.

In Example 19, the subject matter of any of Example 15 to 17 can optionally include a gate dielectric layer disposed between the gate electrode and the microelectronic substrate.

In Example 20, the subject matter of Example 19 can optionally include the gate dielectric layer comprising a conformal layer abutting the gate electrode.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A method of fabricating a microelectronic transistor comprising:
   forming a microelectronic substrate;
   forming a source region and a drain region in the microelectronic substrate;
   forming an interlayer dielectric material over the microelectronic substrate;
   forming a source contact extending through the interlayer dielectric material and electrically contacting the source region;
   forming a drain contact extending through the interlayer dielectric material and electrically contacting the drain region;
   forming a gate electrode positioned between the source contact and the drain contact;
   forming an airgap spacer positioned between the gate electrode and at least one of the source contact and the drain contact;
   forming a sacrificial material layer on the microelectronic substrate and forming a hard mask material layer on the sacrificial material layer prior to forming a source region and a drain region in the microelectronic substrate;
   patterning an etch block structure on the hard mask material layer, wherein the etch block structure has low etch selectivity to the hard mask material layer;
   etching the sacrificial material layer and the hard mask material layer to form a sacrificial gate material structure with a hard mask thereon, wherein the etch block structure shrinks during the etching process to form curved surfaces of the hard mask prior to forming of the interlayer dielectric material;
   planarizing the interlayer dielectric material to expose a portion of the hard mask;
   selectively etching a trench through a portion of the sacrificial gate material structure, wherein a portion of the interlayer dielectric material abutting the hard mask curved surfaces extends over and protects a portion of the hard mask and a portion of the sacrificial gate material structure that remains after the selective etching of the trench;
   forming a gate dielectric layer and the gate electrode in the trench, wherein the gate dielectric layer is disposed between the gate electrode and the microelectronic substrate; and
   removing the portion of the sacrificial gate material remaining after selectively etching the trench to form the airgap spacer.

2. The method of claim 1, wherein forming the airgap spacer comprises forming a void having a gas disposed therein.

3. The method of claim 2, wherein forming the void having the gas disposed therein comprises forming the void having air disposed therein.

4. The method of claim 1, wherein forming the gate dielectric layer and the gate electrode in the trench comprises forming a conformal gate dielectric layer within the trench and forming the gate electrode on the gate dielectric layer.

5. A method of fabricating a microelectronic transistor comprising:
   forming a microelectronic substrate;
   forming a source region and a drain region in the microelectronic substrate;
   forming an interlayer dielectric material over the microelectronic substrate;
   forming a source contact extending through the interlayer dielectric material and electrically contacting the source region;
   forming a drain contact extending through the interlayer dielectric material and electrically contacting the drain region;
   forming a gate electrode positioned between the source contact and the drain contact; and
   forming an airgap spacer positioned between the gate electrode and at least one of the source contact and the drain contact, wherein forming the airgap spacer comprises:
      forming a sacrificial material structure on the microelectronic substrate prior to forming the interlayer dielectric, wherein a top surface of the sacrificial material structure is smaller than and aligned with an opposing bottom surface of the sacrificial material structure that abuts the microelectronic substrate;
      planarizing the interlayer dielectric material to expose the top surface of the sacrificial material structure;
      selectively etching a trench through a portion of the sacrificial material structure, wherein a portion of the interlayer dielectric material extends over and protects a portion of the sacrificial material structure that remains after the selective etching of the trench;
      forming a gate dielectric layer and the gate electrode in the trench, wherein the gate dielectric layer is disposed between the gate electrode and the microelectronic substrate; and
      removing the portion of the sacrificial gate material remaining after selectively etching the trench to form the airgap spacer.

6. The method of claim 5, wherein forming the gate dielectric layer and the gate electrode in the trench comprises forming a conformal gate dielectric layer within the trench and forming the gate electrode on the gate dielectric layer.

7. The method of claim 5, wherein forming the airgap spacer comprises forming a void having a gas disposed therein.

8. The method of claim 7, wherein forming the void having the gas disposed therein comprises forming the void having air disposed therein.

* * * * *